United States Patent [19]

Yew

[11] 4,445,039
[45] Apr. 24, 1984

[54] HIGH THROUGHPUT/HIGH RESOLUTION PARTICLE BEAM SYSTEM

[75] Inventor: Nelson C. Yew, Hillsborough, Calif.

[73] Assignee: The Perkin-Elmer Corp., Norwalk, Conn.

[21] Appl. No.: 280,416

[22] Filed: Jul. 6, 1981

[51] Int. Cl.³ .............................................. A01J 37/26
[52] U.S. Cl. ................................... 250/492.2; 250/398
[58] Field of Search ................... 250/398, 492.2, 492.3; 219/121 EB, 121 EM

[56] References Cited

U.S. PATENT DOCUMENTS 3,900,737  8/1975  Collier et al. ................... 250/492.2
4,283,631  8/1981  Turner ............................... 250/398
4,363,953  12/1982 Katsuta et al. .................. 250/492.2

FOREIGN PATENT DOCUMENTS 53-126277  4/1978  Japan ............................... 250/492.2

OTHER PUBLICATIONS

"Automatic Electron Beam Fabrication of Micron-Size Devices," Wilson et al., *Scanning Electron Microscopy*, Apr. 1976, pp. 659–668.

*Primary Examiner*—Bruce C. Anderson
*Attorney, Agent, or Firm*—S. A. Giarratana; T. P. Murphy; J. R. Dwyer

[57] ABSTRACT

A particle beam lithographic system and method using smaller address structure particle beam for generating masks for integrated circuit technology utilizing an electrostatic deflector system to sweep the beam in the serpentine path for increased throughput.

10 Claims, 5 Drawing Figures

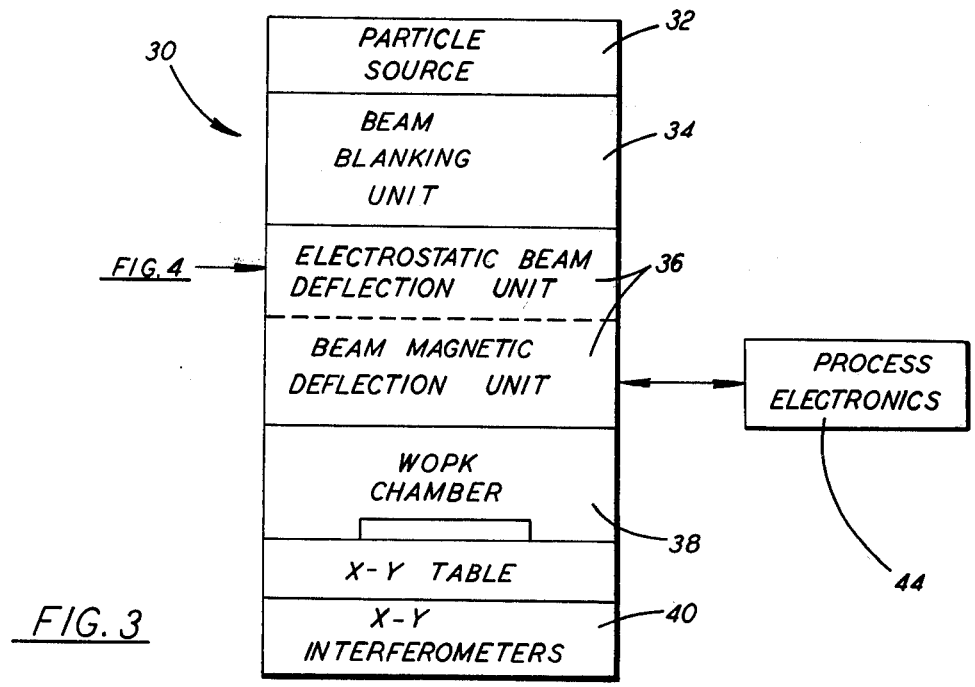
FIG. 3
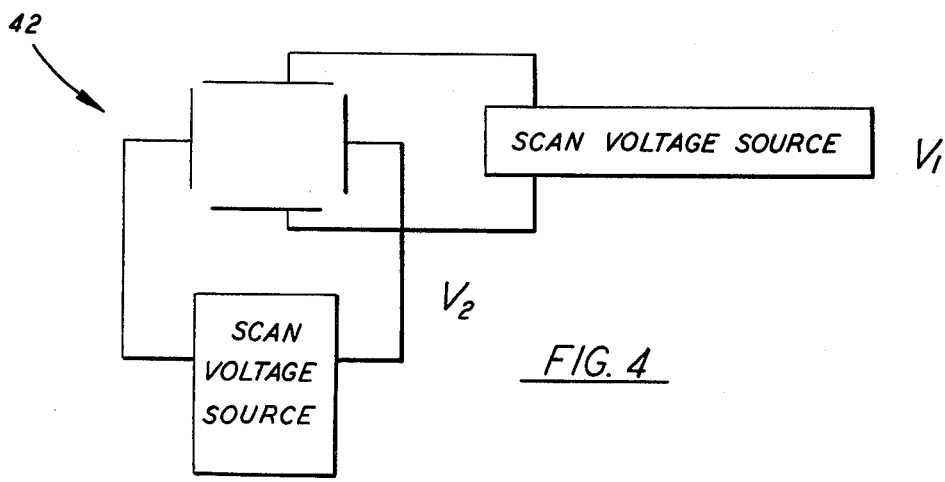
FIG. 4
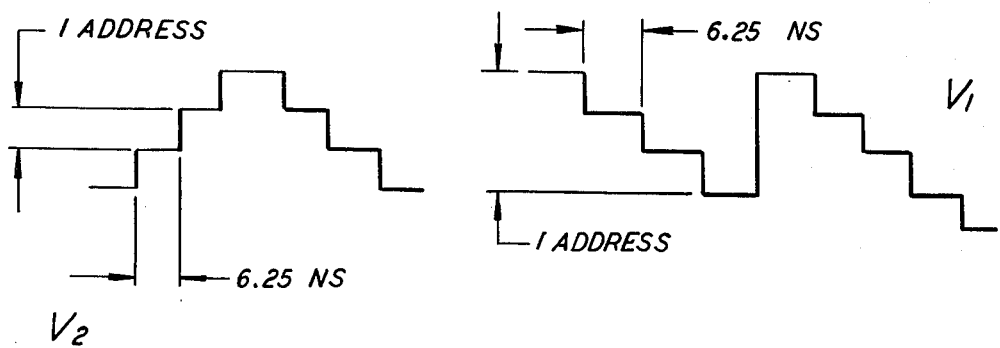

HIGH THROUGHPUT/HIGH RESOLUTION PARTICLE BEAM SYSTEM

BACKGROUND OF THE INVENTION

1. Field of Invention

This invention relates to particle beam systems used in the fabrication of micro-miniature devices (integrated circuits) and is particularly directed to a new and improved apparatus and writing technique for a particle beam lithography system.

2. Prior Art

Lithographic systems utilizing a controllable electron beam for the fabrication of master masks for making integrated circuits is old in the art; one such system is described at length in the U.S. Pat. No. 3,900,737 to Collier, et al. An apparatus for controlling an electron beam by a magnetic deflection system for use in the Collier, et al., system is shown in the U.S. Pat. No. 3,801,792 to Lin.

In the Collier patent, and utilizing an apparatus as described in the Lin patent, the mask medium (resist material) upon which the electron beam is to perform its writing operation, was positioned on a motor driven stage which moved continuously and in synchronism as the beam is scanned in raster fashion in a direction perpendicular to the stage motion.

FIG. 1 herein illustrates a writing operation in an electron beam apparatus similar to the writing operation taught in the Collier patent. As shown in the Figure, the arrow X represents the movement of the stage 12 and the Y arrow represents the movement of the electron beam in a raster scan fashion by a magnetic deflection system. In this prior art embodiment, there are 512 addresses in the Y direction and 16K addresses in the X direction; an address being defined as the diameter of the electron beam spot on the medium. The circles 14 in FIG. 1 represent electron beam spots on the resist 16 and to illustrate the effect of the modulation of the electron beam certain of the spots are shown blank while others are shown solid. Modulation in the Collier, et al., apparatus occurred at the rate of 10 MHz with four rows of addresses defining a 2.0 micrometer feature width and 512 addresses defining a stripe width of 128 micrometers utilizing an address of 0.5 micrometers. There is a requirement for smaller geometry and address structure electron beam generated masks. However, when the address structure is reduced, the mask making throughput is decreased proportional to the square of the address size. At this same time, the stage speed and deflection length of the beam are both reduced by the same factor as the address reduction.

Thus, if the electron beam is decreased below the 0.5 micrometer address, such as used in the Collier, et al apparatus, as for example to a 0.25 micrometer address, the mask making throughput utilizing the raster scan writing technique of Collier, et al., will be reduced by one-fourth.

SUMMARY OF THE INVENTION

It is therefore a primary object of this invention in the art of particle beam lithography to provide higher throughput of mask writing at addresses smaller than 0.5 micrometer yet maintaining the writing output approximately equal to the currently existing 0.5 micrometer throughput.

It is also an object of this invention to maintain the currently existing throughput without major revamping of the current stage hardware of a particle beam apparatus.

In order to accomplish the foregoing object, the normal, i.e., that of Collier, et al., stage speed and deflection length are maintained but an additional electrostatic deflection system located at the appropriate location in the beam column is added to sweep the beam in a small serpentine path in synchronism with the normal Y scan.

As will be apparent to those skilled in the art, upon a study of the drawings and the following detailed description that an effective 80 MHz or higher writing rate at a 0.25 micrometer address or smaller is thus achievable.

BRIEF DESCRIPTION OF THE DRAWINGS

FIG. 3 illustrates the apparatus in which the foregoing writing technique may be performed, and FIG. 4 illustrates schematically the deflection plates and voltage applied thereto for performing the writing technique in the apparatus of FIG. 3.

DETAILED DESCRIPTION

Figure 1:
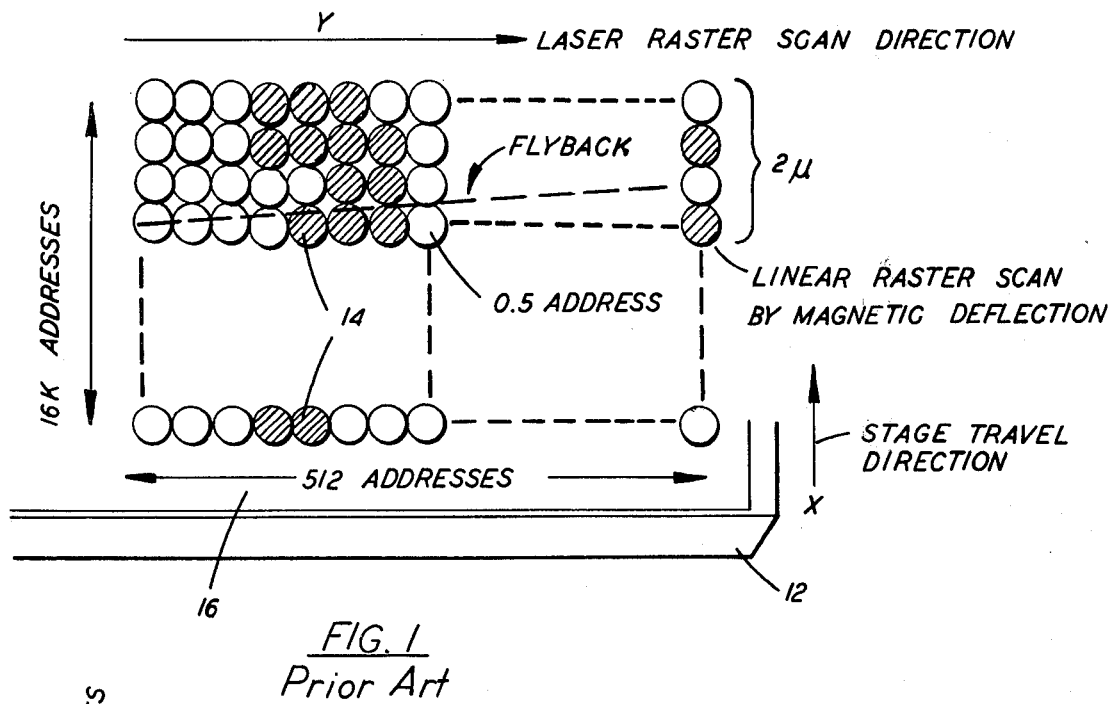
FIG. 1 illustrates the prior art writing technique.
Figure 2:
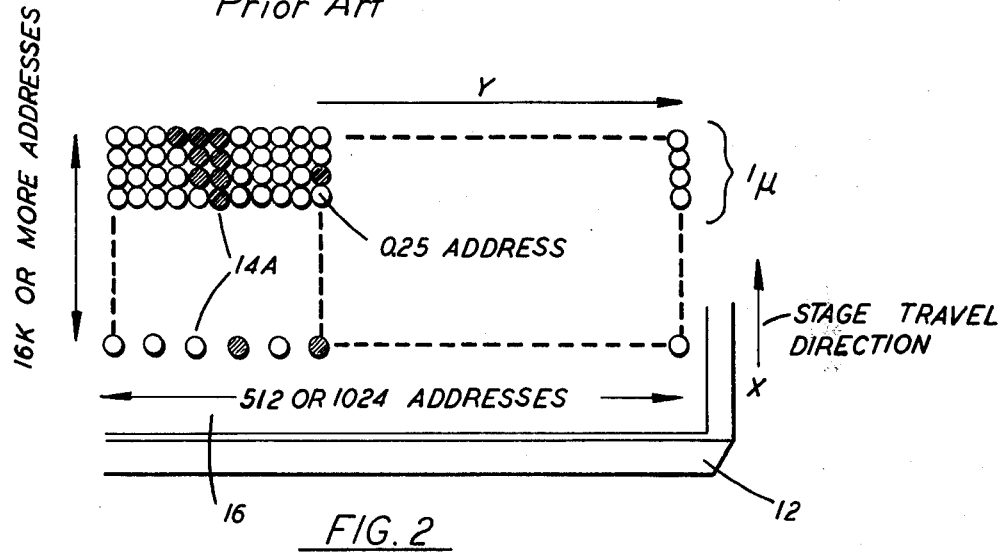
FIGS. 2 and 2A illustrate the writing technique in accordance with the teachings of this invention, FIG. 2A being an enlargement of a portion of FIG. 2 for clarity.
Figure 2A:
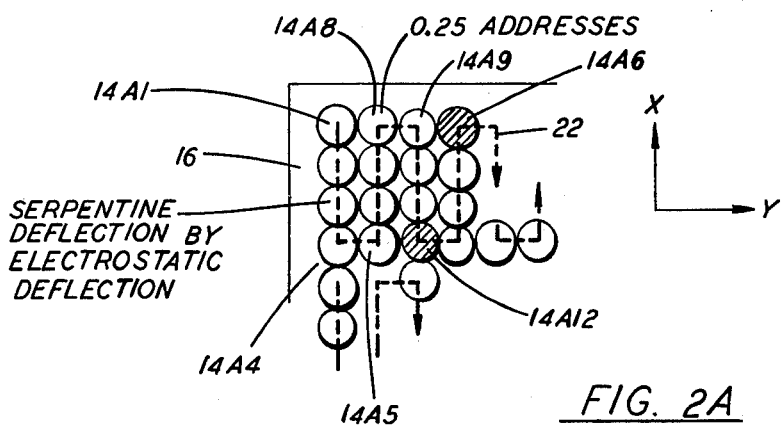

Turning now to FIGS. 2 and 2A (since FIG. 1 was discussed supra), it can be seen that the arrow identified as X represents the travel of the stage 12 and the arrow identified as Y represents the direction of travel of the particle beam in a particle beam lithographic system indicated in its entirety as 30 (FIGS. 3 and 4).

In this embodiment, like the prior art discussed above, there are 16K addresses in the X direction, although the stripe length could be longer, and 512 to 1,044 addresses in the Y direction to define a stripe. Again, the size of the address is represented by blank and solid circles 14A on a radiation sensitive resist layer 16 located on the stage 12; the blank and solid circles representing the modulation of the intensity of the particle beam in accordance with a specified pattern. These spots have 0.25 address size. Since only the size of the spots differ from those of the prior art, they were given the same reference numerals in FIGS. 2 and 2A as in FIG. 1 except for the suffix A to denote this size difference.

As can be seen in FIG. 2A, specifically, which is an enlarged version, for clarity, of part of FIG. 2, the 0.25 address, in addition to being moved in the X direction by the stage, is scanned in the Y direction in a serpentine path represented by the arrow 22 over four spots to thus define a feature width 1.0 micrometer. The serpentine path is formed by starting a spot 14A-1 and travelling against the direction of the stage travel defines a column ending at spot 14A-4. Thereafter the beam is moved in the Y direction to the next contiguous spot 14A-5 and then, travelling in the same direction as the stage, arrives at spot 14A-8. At this point the beam is again moved in the Y direction to form the next contiguous spot 14A-9 and again against the travel of the stage to spot 14A-12. This path of travel continues until it reaches a stripe width defined by the 512 or 1,044 address.

In FIG. 4 there is shown the particle beam lithographic system 30 for the above writing technique which comprises a particle or electron source 32, a beam blanking unit 34 for providing the intensity modulation of the beam (the blank and dark spots 14A referred to above), a beam deflection unit 36, a work chamber 38 containing the stage 12 and a means 40 for determining the registration of the beam at the proper coordinates. The beam deflection unit 36 differs from the prior art deflection unit, such as the magnetic deflection unit shown in the Collier, et al., patent or in the Lin patent, by an additional electrostatic deflection unit 42 located above, i.e., prior to the magnetic deflection means, to which are applied suitable scan voltages synchronized to the writing clock of the system as shown in FIG. 4. These deflection plates used to control the path of the particle beam to define the serpentine path described above are subjected to stepped voltages from conventional step voltage sources to provide a dwell time at each address in the serpentine path to avoid skewing of the path as it is formed.

From the foregoing it can be seen that there is disclosed a method and apparatus for making masks in the integrated circuit art where the particle beam irradiates a radiation sensitive resist layer on a flat wafer in the serpentine scanning technique to define lines on the layer having a preselected modulation pattern. The lines can form any selected pattern on the resist layer to define areas of identical patterns in a matrix form or otherwise in response to the processing electronics illustrated at 44 in FIG. 3. The process electronics may be conventional as taught, for example, in the Collier, et al., patent and the mask resist processed in the conventional manner.

What is claimed is:

1. In a raster scan particle beam system for selectively irradiating a radiation sensitive resist layer located on a continuously moving stage the throughput of which system is determined by a selected spot size diameter and beam deflection length together with the movement of the particle beam in rows in raster scan fashion as the stage moves at a given speed at a right angle to the direction of movement of said beam, means for improving the throughput thereof, comprising, means for sequentially scanning a particle beam of lesser diameter than said first mentioned spot size diameter in a serpentine path to define a stripe, and means for intensity modulating said particle beam in accordance with a selected specified pattern.

2. The system as claimed in claim 1 wherein said beam defines an address of less than 0.5 micrometers.

3. The system as claimed in claim 2 wherein said address is 0.25 micrometers.

4. In a raster scan system having a continuously moving stage, a method for improving the throughput of said system in the fabrication of microminiature devices which involves selectively irradiating multiple regions of a radiation sensitive resist layer located on said stage the throughput of said system having been determined by a selected spot size diameter and beam deflection length together with the movement of a particle beam in rows in raster scan fashion across said larger continuously moving at a given speed in a direction at a right angle to the direction of movement of said beam, comprising the steps of;

controlling said beam to have a lesser diameter than said selected spot size diameter and to irradiate in sequence a plurality of lines by following a serpentine path in adjacent columns, and repeating said irradiation with respect to abutting sets of columns to define a pattern of multiple regions.

5. A method is claimed in claim 4 wherein said resist layer is disposed of a planar layer and further including the step of processing said irradiated resist layer and said planar layer to define multiple patterns in said planar layer.

6. The method as claimed in claim 4 wherein said lines are less than 0.5 micrometers.

7. The method as claimed in claim 4 wherein said lines are less than 0.25 micrometers.

8. A method of improving the throughput and resolution of a raster scan electron beam lithographic machine, the throughput of which is determined by a selected beam spot size diameter and beam deflection length together with the movement of the electron beam in rows in raster scan fashion across a medium continuously moving at a given speed in a direction at a right angle to the direction of movement of said beam, comprising the steps of;

selecting a smaller beam spot diameter than said first mentioned selected beam diameter, and moving said smaller beam in a direction to form side-by-side columns of smaller beam spots by alternately directing said beam in the same direction and against the direction of movement of said medium until the number of columns equals the beam deflection length which in part determined the throughput of the lithographic machine and maintaining the speed of movement of said medium at the same speed as that which in part determined the throughput of the lithographic machine to define a pattern of higher resolution on the medium but with the same throughput of the machine.

9. The method as claimed in claim 8 wherein said small beam is modulated to form a pattern of exposed and non-exposed small beam spots on said medium.

10. The method as claimed in claim 9 wherein the selected electron beam spot size forms a 0.5 micrometer address and the smaller electron beam spot size forms a 0.25 micrometer address.

* * * * *